(12) United States Patent
Vijselaar et al.

(10) Patent No.: US 12,153,354 B2
(45) Date of Patent: Nov. 26, 2024

(54) METHOD OF USING A DUAL STAGE LITHOGRAPHIC APPARATUS AND LITHOGRAPHIC APPARATUS

(71) Applicant: ASML NETHERLANDS B.V., Veldhoven (NL)

(72) Inventors: Wouter Jan Cornelis Vijselaar, 's Hertogenbosch (NL); Hugo Thomas Looijestijn, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 116 days.

(21) Appl. No.: 17/792,852

(22) PCT Filed: Dec. 21, 2020

(86) PCT No.: PCT/EP2020/087479
§ 371 (c)(1),
(2) Date: Jul. 14, 2022

(87) PCT Pub. No.: WO2021/155991
PCT Pub. Date: Aug. 12, 2021

(65) Prior Publication Data
US 2023/0010584 A1  Jan. 12, 2023

(30) Foreign Application Priority Data
Feb. 6, 2020 (EP) .................................. 20155876

(51) Int. Cl.
*G03F 7/00* (2006.01)
(52) U.S. Cl.
CPC ...... *G03F 7/70875* (2013.01); *G03F 7/70525* (2013.01); *G03F 7/70716* (2013.01)
(58) Field of Classification Search
CPC ............. G03F 7/70875; G03F 7/70525; G03F 7/70716; G03F 7/70725
See application file for complete search history.

(56) References Cited

U.S. PATENT DOCUMENTS 5,610,683 A * 3/1997 Takahashi ........... G03F 7/70341
355/53
6,020,964 A    2/2000 Loopstra et al.
(Continued)

FOREIGN PATENT DOCUMENTS

| CN | 210378984 | 4/2020 |
|----|-----------|--------|
| EP | 1353234   | 10/2003 |

(Continued)

OTHER PUBLICATIONS

International Search Report and Written Opinion issued in corresponding PCT Patent Application No. PCT/EP2020/087479, dated Apr. 1, 2021.

(Continued)

*Primary Examiner* — Hung V Nguyen
(74) *Attorney, Agent, or Firm* — Pillsbury Winthrop Shaw Pittman, LLP

(57) ABSTRACT

A method of using a dual stage lithographic apparatus, wherein the lithographic apparatus includes: two substrate supports each arranged to move and support a substrate, a measure field in which selectively one of the two substrate supports is positioned to measure a feature of the substrate supported by the respective one of the two substrate supports, and an expose field in which selectively one of the two substrate supports is positioned to expose the substrate supported by the respective one of the two substrate supports to a patterned beam of radiation, the method including thermal relaxation of a substrate loaded on one of the two substrate supports, wherein the thermal relaxation is at least partially performed at the expose field and/or in transfer between the measure field and the expose field.

20 Claims, 7 Drawing Sheets

(56) References Cited

U.S. PATENT DOCUMENTS

| | | | |
|---|---|---|---|
| 6,645,701 B1 | 11/2003 | Ota et al. | |
| 6,952,253 B2 | 10/2005 | Lof et al. | |
| 9,207,549 B2 * | 12/2015 | Shibazaki | G03F 9/7049 |
| 11,378,893 B2 * | 7/2022 | Cadee | G03F 7/70808 |
| 2005/0046934 A1 * | 3/2005 | Ho | G03F 7/70341 |
| | | | 359/380 |
| 2006/0087637 A1 | 4/2006 | Ottens et al. | |
| 2006/0114444 A1 | 6/2006 | Kuo | |
| 2007/0058173 A1 | 3/2007 | Holzapfel | |
| 2010/0060869 A1 | 3/2010 | Voznyi et al. | |
| 2010/0118285 A1 | 5/2010 | Miyazaki | |
| 2019/0377270 A1 * | 12/2019 | Kanehara | G03F 7/70341 |

FOREIGN PATENT DOCUMENTS

| | | |
|---|---|---|
| JP | 2006013090 | 1/2006 |
| JP | 2010067964 | 3/2010 |
| JP | 2010165752 | 7/2010 |
| WO | 2018065222 | 4/2018 |

OTHER PUBLICATIONS

Office Action issued in corresponding Japanese Patent Application No. 2022-542724, dated Sep. 4, 2023.

\* cited by examiner

METHOD OF USING A DUAL STAGE LITHOGRAPHIC APPARATUS AND LITHOGRAPHIC APPARATUS

CROSS-REFERENCE TO RELATED APPLICATION

The application is the U.S. national phase entry of PCT Patent Application No. PCT/EP2020/087479 which was filed on Dec. 21, 2020, which claims the benefit of priority of European Patent Application No. 20155876.4 which was filed on Feb. 6, 2020, and which is incorporated herein in its entirety by reference.

FIELD

The present invention relates to a method of using a dual stage lithographic apparatus and a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In an embodiment of a lithographic apparatus, the apparatus comprises two substrate supports each arranged to move and support a substrate. The substrate supports can be positioned in a measure field in which selectively one of the two substrate supports is positioned to measure a feature of the substrate supported by the respective one of the two substrate supports, and an expose field in which selectively one of the two substrate supports is positioned to expose the substrate supported by the respective one of the two substrate supports to a patterned beam of radiation. The advantage of such lithographic apparatus, often indicated as dual stage lithographic apparatus, is that simultaneously a first substrate can be processed at the measure field and a second substrate at the expose field. The substrate supports are alternately used at the measure field and the expose field. As a consequence, the idle time of the projection system at the expose field can be decreased.

Most of the current lithographic products are constructed on silicon substrates. However, for certain applications, such as the construction of thin film heads, commonly used in hard disk drives, aluminum-titanium-carbide (AlTiC) substrates may be used. Aluminum-titanium-carbide substrates are prone to temperature induced stress. Stress mechanically deforms the substrate and has significant impact on focus and overlay. Therefore, an aluminum-titanium-carbide substrate has to come in equilibrium with the temperature of the substrate support to release induced stress. This so-called thermal relaxation of aluminum-titanium-carbide substrates takes significantly longer than silicon substrates.

To allow the aluminum-titanium-carbide substrate to come in equilibrium with the temperature of the substrate support the substrate is loaded on a substrate support positioned at the measure field and thermal relaxation takes place on the substrate support. Typically, a thermal relaxation time of at least 20 seconds may be needed for sufficient thermal relaxation of the substrate on the substrate support.

The requirement of a thermal relaxation time of 20 seconds significantly decreases the throughput of the lithographic apparatus, i.e. the number of processed substrates per hour.

SUMMARY

It is an object of the invention to provide a method of using a dual stage lithographic apparatus, wherein the method comprises the step of thermal relaxation of a substrate for a longer time and wherein the negative effect of the thermal relaxation time on throughput is decreased with respect to a conventional method of using a dual stage lithographic apparatus.

According to an aspect of the invention, there is provided a method of using a dual stage lithographic apparatus, wherein the lithographic apparatus comprises:
  two substrate supports each arranged to move and support a substrate,
  a measure field in which selectively one of the two substrate supports is positioned to measure a feature of the substrate supported by the respective one of the two substrate supports, and
  an expose field in which selectively one of the two substrate supports is positioned to expose the substrate supported by the respective one of the two substrate supports to a patterned beam of radiation,
wherein the method comprises the step of thermal relaxation of a substrate loaded on one of the two substrate supports, wherein the thermal relaxation is at least partially performed at the expose field and/or in transfer between the measure field and the expose field.

According to an aspect of the invention, there is provided a lithographic apparatus, comprising:
  two substrate supports each arranged to move and support a substrate,
  a measure field in which selectively one of the two substrate supports is positioned to measure a feature of the substrate supported by the respective one of the two substrate supports, and
  an expose field in which selectively one of the two substrate supports is positioned to expose the substrate supported by the respective one of the two substrate supports to a patterned beam of radiation,
wherein the lithographic apparatus comprises a control device arranged to transfer during a step of thermal relaxation of a substrate loaded on one of the two substrate supports, the respective one of the two substrate supports to the expose field, such that the thermal relaxation is at least partially performed at the expose field and/or in transfer between the measure field and the expose field.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
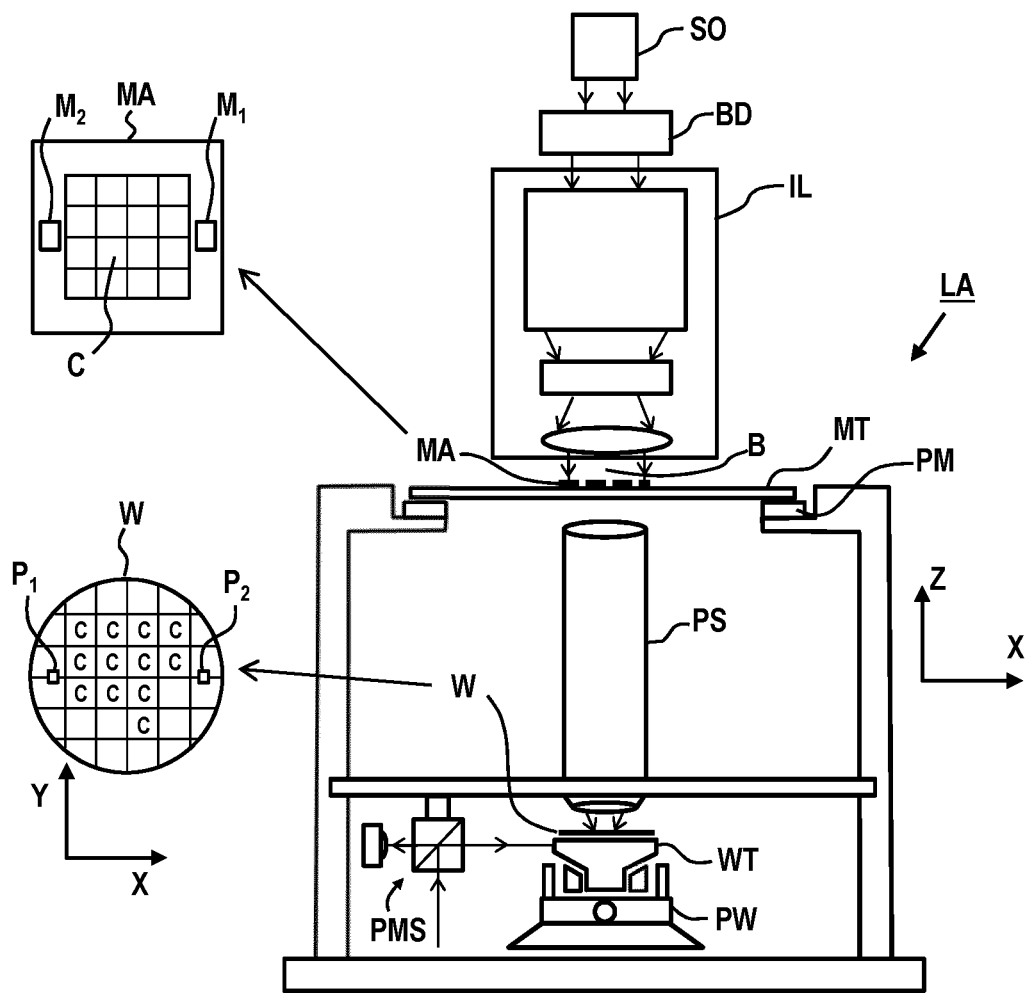
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
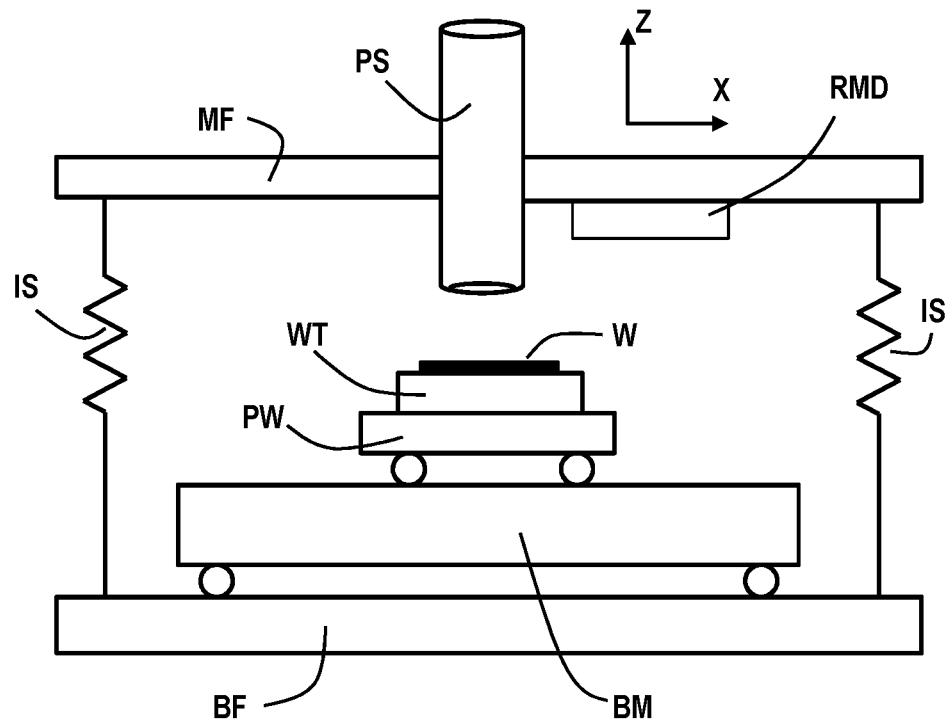
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
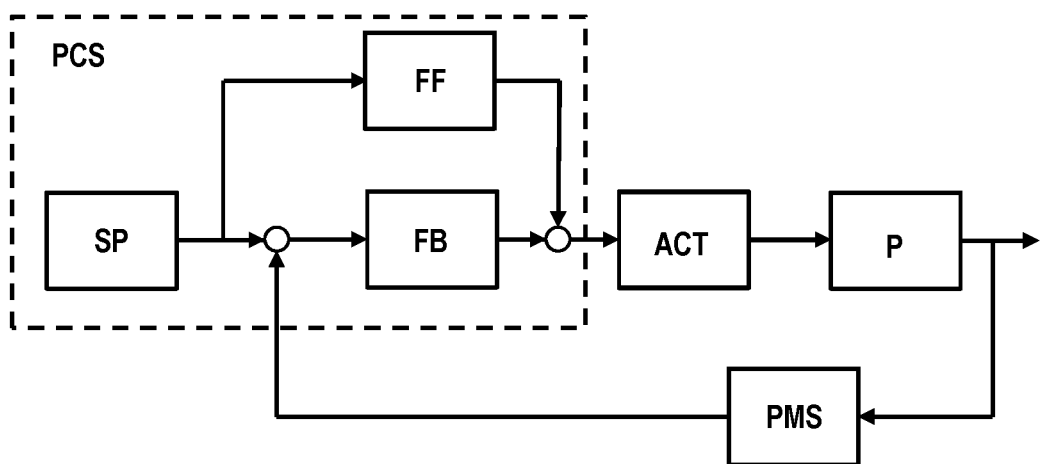
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
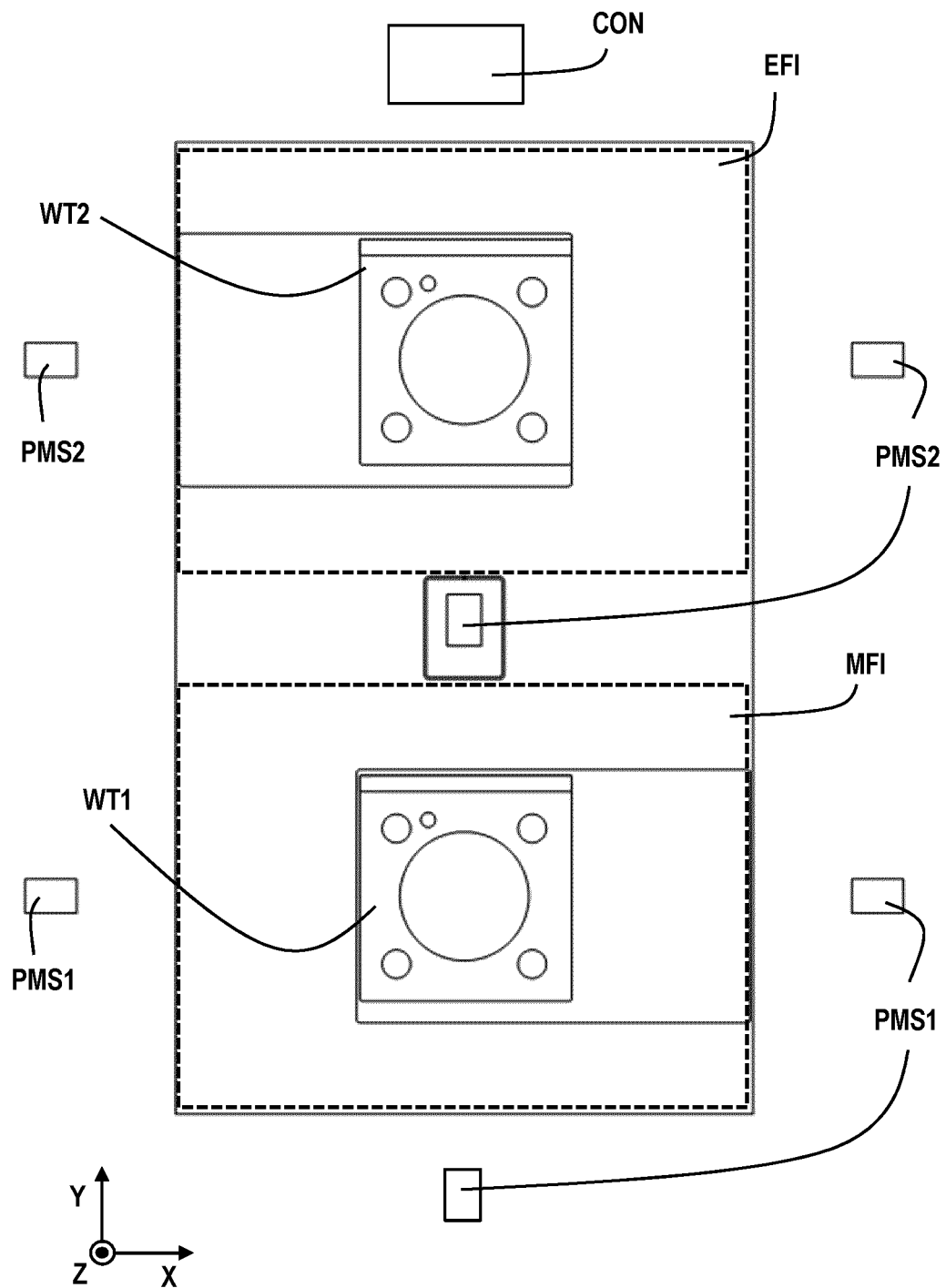
FIG. 4 depicts schematically the first substrate support and the second substrate support of a dual stage lithographic apparatus

FIG. 4 shows a top view of a first substrate support WT1 and a second substrate support WT2 of a dual stage lithographic apparatus. The first substrate support WT1 and the second substrate support WT2 are each arranged to support a substrate. The first substrate support WT1 and the second substrate support WT2 can be moved in a measure field MFI and an expose field EFI. A control device CON is provided to control movements of the first substrate support WT1 and the second substrate support WT2.

The measure field MFI and the expose field EFI extend in a positioning plane extending in y-direction and x-direction. In the measure field MFI, the first substrate support WT1 or the second substrate support WT2 may cooperate with one or more first processing devices to process the substrate supported by the first substrate support WT1 or the second substrate support WT2, respectively. In the expose field EFI, the first substrate support WT1 or the second substrate support WT2 may cooperate with one or more second processing devices to process the substrate supported by the first substrate support WT1 or the second substrate support WT2, respectively. The measure field MFI and an expose field EFI are arranged adjacent to each other in the y-direction.

In the expose field EFI, the one or more processing devices comprise a projection system arranged to project a patterned radiation beam on the substrate. The one or more processing devices in the expose field EFI may for example further comprise processing devices to cooperate with a zeroing location and an aberration control measurement sensor mounted on each of the first substrate support WT1 and the second substrate support WT2.

In the measure field MFI, a feature of a substrate may be measured by a measurement sensor. For example, the upper surface of the substrate may be measured by a level sensor to determine a height map of this upper surface of the substrate. This height map may be used during projection of the patterned radiation beam at the expose field EFI to improve the positioning of the upper surface of the substrate with respect to the incident patterned radiation beam. Further, at the measure field MFI, a substrate may be loaded on and unloaded from the first substrate support WT1 or the second substrate support WT2, respectively.

A first position measurement system PMS1 is arranged to measure a position of the first substrate support WT1 or the second substrate support WT2, when positioned at the measure field MFI. A second position measurement system PMS2 is arranged to measure a position of the first substrate support WT1 or second substrate support WT2, when positioned at the expose field EFI. The first position measurement system PMS1 and the second position measurement system PMS2 are for example interferometer systems.

In FIG. 4, the first substrate support WT1 is arranged at the measure field MFI and the second substrate support WT2 is arranged at the expose field EFI. The first substrate support WT1 and the second substrate support WT2 can be swapped in position in the y-direction such that the first substrate support WT1 and the second substrate support WT2 can alternately be used in the measure field MFI and the expose field EFI.

Figure 5:
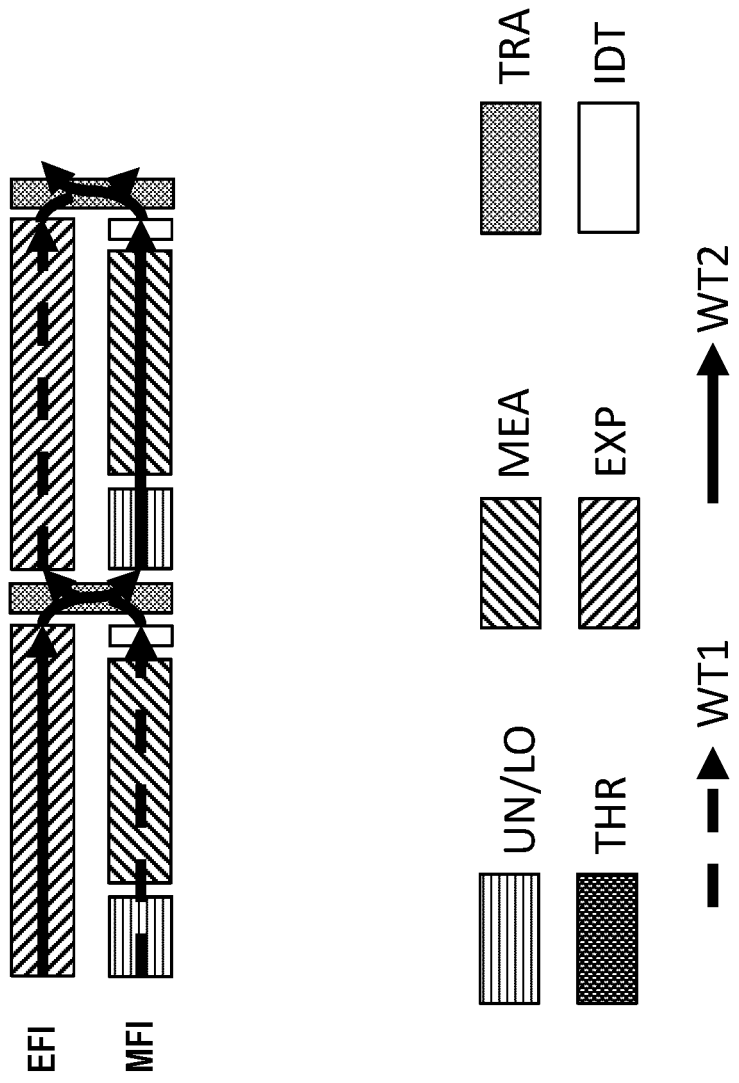
FIG. 5 depicts schematically the sequence of steps for processing silicon substrates in a conventional method of using a dual stage lithographic apparatus

FIG. 5 shows a sequence of simultaneous activities during conventional processing of silicon substrates in the lithographic apparatus at the measure field MFI and the expose field EFI. The position of the first substrate support WT1 is indicated by a dashed line and the position of the second substrate support WT2 is indicated by a solid line.

At the beginning of the sequence, the first substrate support WT1 is positioned in the measurement field MFI for the step UN/LO for unloading a processed substrate from the first substrate support WT1 and loading a new substrate on the first substrate support WT1. After loading a new (to be processed) substrate the upper surface of the substrate is measured by the level sensor in step MEA. This step MEA may also include other tasks associated with the measurement of the upper surface of the substrate, such as alignment and control measurements. At the same time, a substrate supported on the second substrate support WT2 is arranged at the expose field EFI where the substrate is exposed to a patterned beam of radiation indicated by step EXP. This step EXP may also include other tasks associated with exposing the substrate to a patterned beam of radiation, such as alignment and control measurements.

Usually, the total time needed for the loading/unloading step UN/LO and the subsequent measurement step MEA is smaller than the time needed for the expose step EXP. Therefore, the first substrate support WT1 may have some idle time IDT after the measurement step, before the first substrate support WT1 and the second substrate support WT2 are swapped in position between the measurement field MFI and the expose field EFI.

The position swap of the first substrate support WT1 and the second substrate support WT2 is indicated by the step TRA. During this position swap, the first substrate support WT1 is transferred from the measure field MFI to the expose field EFI and the second substrate support WT2 is transferred from the expose field EFI to the measure field MFI.

After the position swap TRA of the first substrate support WT1 and the second substrate support WT2, the substrate supported on the first substrate support WT1 is exposed at the expose field EFI to a patterned beam of radiation. Simultaneously, the substrate supported on the second substrate support WT2 may, in step UN/LO be unloaded from the second substrate support WT2 and a new substrate may be loaded on the second substrate support WT2. Thereafter, the upper surface of the new substrate supported on the second substrate support WT2 may be measured by a level sensor in a measurement step MEA.

Again, the total time needed for the loading/unloading step UN/LO and the subsequent measurement step MEA with respect to the second substrate support WT2 is smaller than the time needed for the expose step EXP of the substrate on the first substrate support WT1. Therefore, the second substrate support WT2 may have some idle time IDT after the measurement step MEA, before the first substrate support WT1 and the second substrate support WT2 are swapped in position between the measurement field MFI and the expose field EFI.

When the expose step of the substrate supported on the first substrate support WT1 is finished, the position swap TRA is carried out, whereby the first substrate support WT1 is transferred from the expose field EFI to the measure field MFI and the second substrate support WT2 is transferred from the measure field MFI to the expose field EFI.

The first substrate support WT1 and the second substrate support WT2 are then again arranged in the starting position of the sequence shown in FIG. 5, and the above-described steps may be repeated for subsequent substrates.

Most of the current lithographic products are constructed on silicon substrates. Silicon substrates require very little thermal relaxation time, since a silicon substrate very quickly adopts to the thermal conditions of the respective substrate support WT1, WT2 on which the silicon substrate is loaded. In the sequence of FIG. 5 the time needed for thermal relaxation is not drawn separately, since this time is relatively short.

However, for certain applications, such as the construction of thin film heads, commonly used in hard disk drives, aluminum-titanium-carbide (AlTiC) substrates may be used. Aluminum-titanium-carbide substrates are prone to temperature induced stress. Stress mechanically deforms the substrate and has significant impact on focus and overlay. Therefore, an aluminum-titanium-carbide substrate has to come in equilibrium with the temperature of the substrate support to release induced stress. This thermal relaxation of aluminum-titanium-carbide substrates takes significantly longer than thermal relaxation of silicon substrates. For example, the time needed for thermal relaxation of an aluminum-titanium-carbide substrate may be more than 100 times the time needed for thermal relaxation of a silicon substrate.

Figure 6:
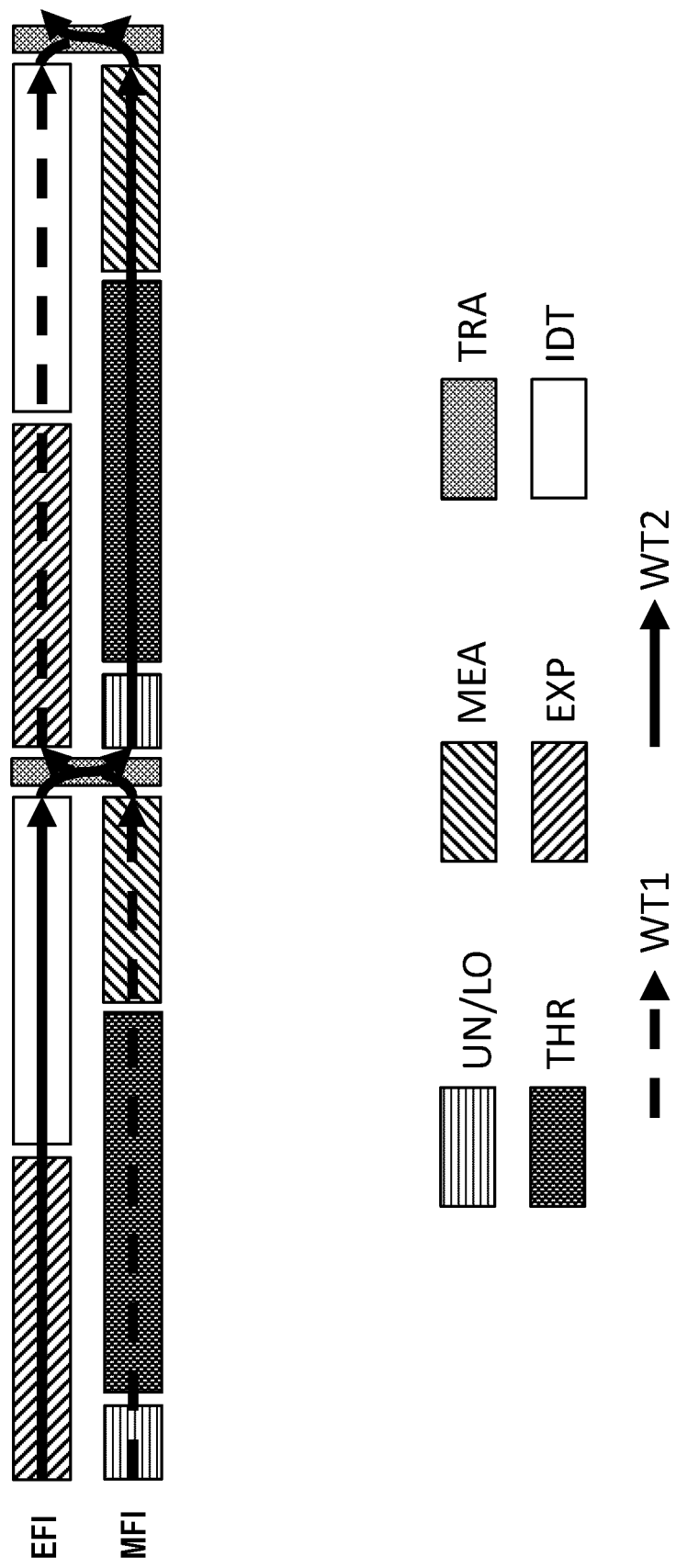
FIG. 6 depicts schematically the sequence of steps for processing aluminum-titanium-carbide substrates in a conventional method of using a dual stage lithographic apparatus.

FIG. 6 shows the sequence of steps in a lithographic apparatus for an aluminum-titanium-carbide substrate which may need a thermal relaxation time of more than for example 20 seconds.

At the beginning of the sequence, the first substrate support WT1 is positioned in the measurement field MFI for the step UN/LO for unloading a processed substrate from the first substrate support WT1 and loading a new substrate on the substrate support WT1. After loading of the substrate a step THR of thermal relaxation is carried out before the step MEA of measuring the upper surface of the substrate by the level sensor is performed. As previously indicated this step MEA may also include other tasks associated with the measurement of the upper surface of the substrate, such as alignment and control measurements. During the thermal relaxation step THR the substrate is allowed to come into equilibrium with the temperature of the respective substrate support WT1, WT2 to release induced stress.

At the same time, a substrate supported on the second substrate support WT2 is arranged at the expose field EFI where the substrate is exposed to a patterned beam of radiation and associated tasks are carried out, indicated by step EXP. Due to the relatively long time needed for the step of thermal relaxation THR, the total time needed for the loading/unloading step UN/LO, the step of thermal relaxation THR and the subsequent measurement step MEA, including associated tasks is significantly longer than the time needed for the expose step EXP. Therefore, the second substrate support WT2 has substantial idle time IDT after the expose step, before the first substrate support WT1 and the second substrate support WT2 can be swapped in position, in step TRA, between the measurement field MFI and the expose field EFI.

After the position swap TRA of the first substrate support WT1 and the second substrate support WT2, the substrate supported on the first substrate support WT1 is exposed at the expose field EFI to a patterned beam of radiation. Simultaneously, the substrate supported on the second substrate support WT2 may, in step UN/LO be unloaded from the second substrate support WT2 and a new substrate may be loaded on the second substrate support WT2. Thereafter, the step of thermal relaxation THR is performed before the upper surface of the new substrate supported on the second substrate support WT2 may be measured by a level sensor in a measurement step MEA.

Again, the total time needed for the loading/unloading step UN/LO, the step of thermal relaxation THR and the subsequent measurement step MEA is significantly longer than the time needed for the expose step EXP, resulting in substantial idle time IDT of the second substrate support WT2 after the expose step before the position swap TRA of the first substrate support WT1 and the second substrate support WT2 can be carried out as a final step of the sequence.

From the sequence shown in FIG. 6, it can be concluded that the thermal relaxation has a significant negative effect on the throughput of the lithographic apparatus.

Figure 7:
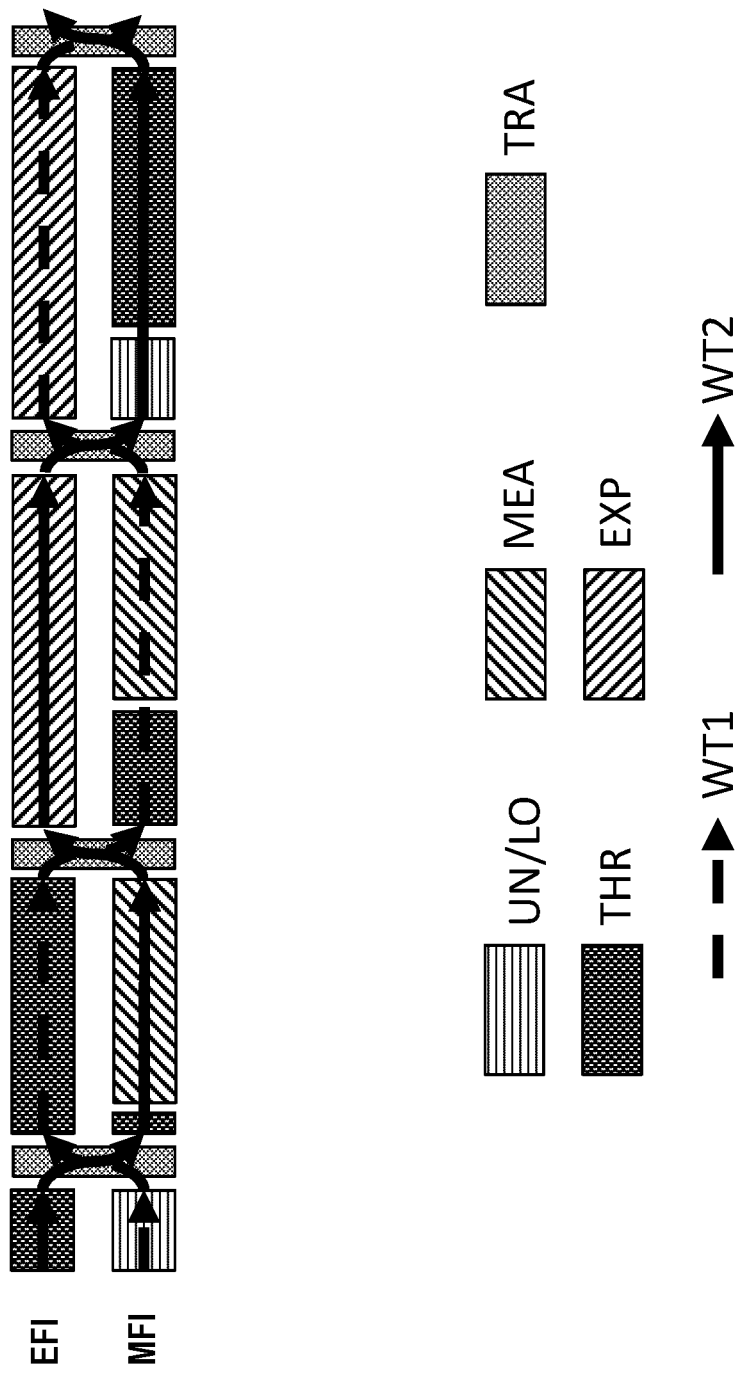
FIG. 7 depicts schematically the sequence of steps for processing aluminum-titanium-carbide substrates in a method of using a dual stage lithographic apparatus according to an embodiment of the invention.

FIG. 7 shows the sequence of steps in a lithographic apparatus for an aluminum-titanium-carbide substrate according to an embodiment of the invention. The main difference with the sequence of FIG. 6 is that the step of thermal relation THR is at least partially carried out at the expose field EFI by transferring during the step of thermal relation THR the respective substrate support WT1, WT2 from the measure field MFI to the expose field EFI and from the expose field EFI back to the measure field MFI.

At the beginning of the sequence of FIG. 7, the first substrate support WT1 is positioned at the measurement field MFI for the step UN/LO for unloading a processed substrate from the first substrate support WT1 and loading a new substrate on the substrate support WT1. After loading of the substrate, a position swap TRA of the first substrate support WT1 and the second substrate support WT2 is directly carried out, whereby the first substrate support WT1 is transferred to the expose field EFI and the second substrate support WT2 is transferred to the measure field MFI. During transfer thermal relaxation of the substrate supported on the first substrate support WT1 is already started.

Since the step of thermal relaxation THR of the second substrate support WT2 was already started, as the substrate was earlier loaded on the second substrate support WT2, the measurement step MEA of the substrate supported on the second substrate support WT2 can be started shortly after the second substrate support WT2 is positioned in the measurement field MFI. As soon as this measurement step of the substrate supported on the second substrate support WT2 is finished, again a position swap TRA of the first substrate support WT1 and the second substrate support WT2 is carried out.

The second substrate support WT2 is transferred from the measure field MFI to the expose field EFI where the substrate is exposed in an expose step EXP to a patterned radiation beam. At the beginning of this expose step EXP, the thermal relaxation step THR of the substrate supported on the first substrate support WT1 which is now again positioned at the measure field MFI still continues. After the step of thermal relaxation THR, the measurement step MEA of the substrate supported on the first substrate support WT1 can be started. In the present embodiment, the start of the measurement step MEA is selected such that the measurement step MEA of the substrate supported on the first substrate support WT1 and the expose step of the substrate supported on the second substrate support WT2 will finish substantially at the same time.

As soon as the measurement step MEA and the expose step EXP are finished a position swap TRA is carried out, whereby the first substrate support WT1 is transferred from the measure field MFI to the expose field EFI and the second substrate support WT2 is transferred from the expose field EFI to the measure field MFI. In the expose field EFI the substrate supported on the first substrate support WT1 is exposed in an expose step EXP to a patterned radiation beam. In the measure field MFI, the exposed substrate supported on the second substrate support WT2 is in step UN/LO unloaded from the second substrate support WT2 and a new substrate is loaded on the first substrate support WT1. The step of thermal relaxation THR starts as soon as the new substrate is loaded on the second substrate support WT2. The second substrate support WT2 remains at the measure field MFI as long as the expose step EXP is carried out with respect to the substrate supported on the first substrate support WT1. When the expose step EXP is finished, a position swap TRA may be carried out to transfer the second substrate support WT2 to the expose field EFI, and the first substrate support WT1 to the measure field MFI. After the position swap TRA, the substrate supported on the first substrate support WT1 can be unloaded and a new substrate may be loaded on the first substrate support WT1. In the meantime, thermal relaxation of the substrate supported on the second substrate support WT2 may continue while being positioned at the expose field EFI. This last position swap TRA, is the final step of the sequence. This sequence may be repeated for processing of further substrates.

From a comparison of the sequence of FIG. 6 and the sequence of FIG. 7, it can be concluded that carrying out the step of thermal relation THR at least partially at the expose field EFI significantly reduces the total time of the sequence of steps to process substrates in the lithographic apparatus. This has a significant positive effect on the throughput of the lithographic apparatus. Moreover, in the embodiment of FIG. 7, there is no idle time after a measure step MEA or an expose step EXP, since all available time is effectively used for thermal relaxation of the respective substrate.

Figure 8:
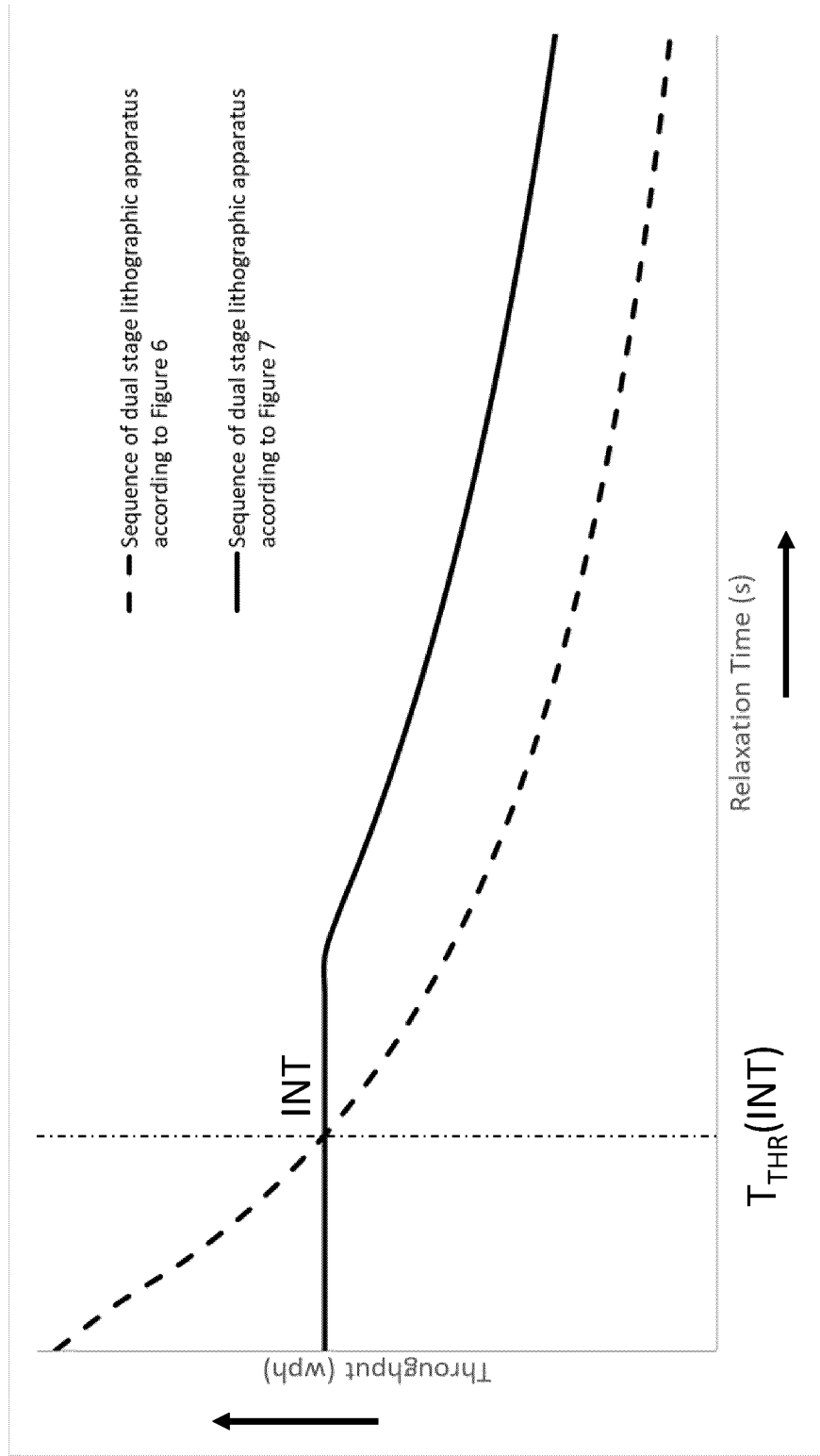
FIG. 8 depicts schematically a comparison of the throughput of the sequence of FIG. 6 and the throughput of the sequence of FIG. 7 in dependence of the required thermal relaxation time.

FIG. 8 shows a graph in which the throughput of substrates in a lithographic apparatus (processed substrates per hour; wph) in dependence of the required time for thermal relaxation is compared for two different processing sequences. A dashed line shows the throughput of a dual stage lithographic apparatus using the conventional processing sequence of FIG. 6 and a solid line shows the throughput of a dual stage lithographic apparatus using the novel processing sequence of FIG. 7.

It can be seen that with a relatively low thermal relaxation time the conventional method of FIG. 6 has a higher throughput than the processing sequence of FIG. 7. This is the result of at least the time needed for two position swaps to move the substrate during the step of thermal relaxation from the measure field MFI to the expose field EFI and from the expose field EFI back to the measure field MFI.

With increasing time needed for thermal relaxation the throughput of the conventional sequence of FIG. 6 will decrease as additional time is required for carrying out the step of thermal relaxation. Since in the sequence of FIG. 7 already time is used for two position swaps, the throughput is initially not decreased with increasing time needed for thermal relaxation, since thermal relaxation may be carried out during the position swaps.

The intersection INT between the dashed line and the solid line indicates the time needed for thermal relaxation for which the sequence of FIG. 6 and the sequence of FIG. 7 results in the same throughput. For thermal relaxation times larger than the thermal relaxation time $T_{THR}(INT)$ associated with the intersection INT, the time efficient use of the expose field for thermal relaxation becomes clear, as the throughput of the sequence of FIG. 7 becomes substantially larger than the throughput of the sequence of FIG. 6. The thermal relaxation time $T_{THR}(INT)$ associated with the intersection INT may for example be in the range of 5 to 15 seconds of time needed for thermal relaxation.

Hereinabove, the sequence of FIG. 7 has been applied for processing aluminum-titanium-carbide substrates. The method may also beneficially be applied for other types of substrates that may require a substantial thermal relaxation time such as indium antimonide (InSb), gallium antimonide (GaSb), gallium nitride (GaN), aluminum nitride (AlN), gallium oxide ($Ga_2O_3$), sapphire ($\alpha$-$Al_2O_3$) and sapphire ($\kappa$-$Al_2O_3$).

In the embodiment of FIG. 7, the time of thermal relaxation of a substrate is a predetermined period of time. This predetermined period of time may for example be based on experiments or calibration measurements with the specific substrate materials.

In another embodiment, the relaxation of the substrate may be measured by measuring the position of alignment marks or similar marks on the substrate. As long as a distance between two alignment marks on the substrate increases thermal relaxation occurs. When the distance no longer changes thermal relaxation is finished. The time period of thermal relaxation may for example be ended when the relaxation, as measured, is below a predetermined threshold value. The advantage of this method is that the exact relaxation is measured, and the measure step MEA can directly be started after it is determined by measurement that relaxation is below a predetermined threshold value. In this method, the time needed for relaxation of substrates of the same type may be different. This may have the consequence that the timing of other steps in the method may have to be actively adapted during the processing of the substrates.

In order to measure the thermal relaxation, a relaxation measuring device RMD configured to measure relaxation of the substrate during at least a part of the thermal relaxation of the substrate can be provided. An embodiment of a relaxation measuring device RMD is shown in FIG. 2. This may be an existing measuring device that can be used to determine a distance between alignment marks or similar marks on the substrate, or the relaxation measuring device RMD may be provided as a separate device. The relaxation measuring device RMD may be arranged at the measure field MFI and/or at the expose field EFI.

In accordance with the invention, the substrate support WT is arranged at the expose field EFI during at least part of the thermal relaxation of the substrate. When the substrate support WT is positioned at the expose field EFI, the substrate support WT can also be used to carry out additional steps at the expose field, such as measuring patterning device properties, patterning device alignment measurements, patterning device shape correction measurements, or measurements of the laser power. Carrying out these measurements during the step of thermal relaxation may further result in lower processing or calibration times and therefore higher throughput of the lithographic apparatus.

In a single stage lithographic apparatus comprising only one substrate support, it may therefore also be beneficial to transfer the substrate support during thermal relaxation of a substrate supported on the substrate support to the expose field to carry out additional steps, such measurements at the expose field so that these measurement do not have to be carried out separately.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of using a dual stage lithographic apparatus, wherein the lithographic apparatus comprises:
   two substrate supports, each support arranged to move and support a substrate,
   a measure field in which selectively one of the two substrate supports is positioned to measure a feature of the substrate supported by the respective one of the two substrate supports, and
   an expose field in which selectively one of the two substrate supports is positioned to expose the substrate supported by the respective one of the two substrate supports to a patterned beam of radiation,
   the method comprising thermal relaxation of a substrate loaded on one of the two substrate supports, wherein the thermal relaxation is at least partially performed at the expose field and/or in transfer between the measure field and the expose field and the thermal relaxation involves a time delay between loading of the substrate onto the one of the two substrate supports and exposure of the substrate at the expose field.

2. The method of claim 1, comprising, for each of the two substrate supports, the sequence of steps of:
   loading a substrate on the respective substrate support at the measure field;
   thermal relaxation of the substrate on the respective substrate support;
   measuring the feature of the substrate at the measure field;

transferring the respective substrate support from the measure field to the expose field;
exposing the substrate to a patterned beam of radiation at the expose field;
transferring the respective substrate support from the expose field to the measure field; and
unloading the substrate on the respective substrate support at the measure field.

3. The method of claim 1, wherein the thermal relaxation comprises transferring the respective substrate support from the measure field to the expose field, maintaining the substrate at the expose field and transferring the respective substrate support from the expose field back to the measure field.

4. The method of claim 1, wherein the thermal relaxation is at least partially performed at the expose field and during thermal relaxation of the substrate at the expose field, one or more of the following steps are carried out at the measure field:
unloading/loading a substrate from/on the other substrate support; and/or
thermal relaxation of the substrate on the other substrate support; and/or
measuring a feature of the substrate on the other substrate support.

5. The method of claim 1, wherein the substrate is a substrate having a silicon content of less than 10% in weight of the substrate.

6. The method of claim 1, wherein the substrate is made of aluminium-titanium-carbide, indium antimonide, gallium antimonide, gallium nitride, aluminum nitride, gallium oxide, and/or sapphire.

7. The method of claim 1, wherein the thermal relaxation takes at least twice the time needed for transfer of a substrate between the measure field and the expose field.

8. The method of claim 1, wherein the thermal relaxation comprises a predetermined time of thermal relaxation.

9. The method of claim 1, wherein the thermal relaxation comprises measuring relaxation of the substrate, and ending thermal relaxation when the relaxation is below a predetermined threshold value.

10. A lithographic apparatus, comprising:
two substrate supports, each support each arranged to move and support a substrate,
a measure field in which selectively one of the two substrate supports is positioned to measure a feature of the substrate supported by the respective one of the two substrate supports, an expose field in which selectively one of the two substrate supports is positioned to expose the substrate supported by the respective one of the two substrate supports to a patterned beam of radiation, and
a control device arranged to cause transfer during a thermal relaxation of a substrate loaded on one of the two substrate supports, the respective one of the two substrate supports to the expose field, such that the thermal relaxation is at least partially performed at the expose field and/or in transfer between the measure field and the expose field and the thermal relaxation involves a time delay between loading of the substrate onto the one of the two substrate supports and exposure of the substrate at the expose field.

11. The lithographic apparatus of claim 10, wherein the substrate is a substrate having a silicon content of less than 10% in weight of the substrate.

12. The lithographic apparatus of claim 10, wherein the substrate is made of aluminium-titanium-carbide, indium antimonide, gallium antimonide, gallium nitride, aluminum nitride, gallium oxide, and/or sapphire.

13. The lithographic apparatus of claim 10, wherein the control device is arranged to carry out thermal relaxation during a predetermined conditioning time.

14. The lithographic apparatus of claim 10, further comprising a relaxation measuring device configured to measure relaxation of the substrate during at least a part of the thermal relaxation of the substrate.

15. The lithographic apparatus of claim 14, wherein the control device is arranged to end thermal relaxation of the substrate, when the relaxation is below a predetermined threshold value.

16. The lithographic apparatus of claim 14, wherein the thermal relaxation is at least partially performed at the expose field and the control device is arranged to control during thermal relaxation of the substrate at the expose field one or more of the following at the measure field:
unloading/loading of a substrate from/on the other substrate support;
thermal relaxation of the substrate on the other substrate support; and/or
measurement of a feature of the substrate on the other substrate support.

17. The lithographic apparatus of claim 14, wherein the control device is arranged to, during the thermal relaxation, cause transfer of the respective substrate support from the measure field to the expose field, cause maintenance of the substrate at the expose field and cause transfer of the respective substrate support from the expose field back to the measure field.

18. The lithographic apparatus of claim 14, wherein the thermal relaxation takes at least twice the time needed for transfer of a substrate between the measure field and the expose field.

19. The lithographic apparatus of claim 14, wherein the control device is further configured, for each of the two substrate supports, cause the sequence of:
loading of a substrate on the respective substrate support at the measure field;
thermal relaxation of the substrate on the respective substrate support;
measurement of the feature of the substrate at the measure field;
transfer of the respective substrate support from the measure field to the expose field;
exposure of the substrate to a patterned beam of radiation at the expose field;
transfer of the respective substrate support from the expose field to the measure field; and
unloading of the substrate on the respective substrate support at the measure field.

20. A computer program product comprising a non-transitory computer-readable medium having instructions therein, the instructions, when executed by a computer system, configured to cause the computer system to at least cause:
in a lithographic apparatus comprising: two substrate supports, each support arranged to move and support a substrate, a measure field in which selectively one of the two substrate supports is positioned to measure a feature of the substrate supported by the respective one of the two substrate supports, and an expose field in which selectively one of the two substrate supports is positioned to expose the substrate supported by the respective one of the two substrate supports to a patterned beam of radiation, thermal relaxation of a substrate loaded on one of the two substrate supports, wherein the thermal relaxation is at least partially performed at the expose field and/or in transfer between the measure field and the expose field and the thermal relaxation involves a time delay between loading of the substrate onto the one of the two substrate supports and exposure of the substrate at the expose field.

* * * * *